(12) United States Patent
Tyler et al.

(10) Patent No.: US 6,611,948 B1
(45) Date of Patent: Aug. 26, 2003

(54) MODELING CIRCUIT ENVIRONMENTAL SENSITIVITY OF A MINIMAL LEVEL SENSITIVE TIMING ABSTRACTION MODEL

(75) Inventors: Sean Tyler, Fort Collins, CO (US); Martin Foltin, Fort Collins, CO (US); Brian Foutz, Ithaca, NY (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/927,220

(22) Filed: Aug. 10, 2001

(51) Int. Cl.[7] .............................................. G06F 17/50
(52) U.S. Cl. ............................................. 716/6; 716/18
(58) Field of Search ........................... 703/19; 716/1–6, 716/18

(56) References Cited

U.S. PATENT DOCUMENTS

| | | | | |
|---|---|---|---|---|
| 4,924,430 A | * | 5/1990 | Zasio et al. .................. | 716/6 |
| 5,475,607 A | * | 12/1995 | Apte et al. ..................... | 716/6 |
| 5,812,561 A | * | 9/1998 | Giles et al. .................. | 714/726 |
| 6,023,568 A | * | 2/2000 | Segal ............................. | 716/6 |
| 6,173,435 B1 | * | 1/2001 | Dupenloup .................. | 716/18 |
| 6,185,723 B1 | | 2/2001 | Burks et al. ................... | 716/6 |
| 6,430,731 B1 | * | 8/2002 | Lee et al. ....................... | 716/6 |

* cited by examiner

*Primary Examiner*—Vuthe Siek
*Assistant Examiner*—Paul Dinh

(57) ABSTRACT

A method and a corresponding apparatus provides for modeling circuit environmental sensitivity for a basic minimal level sensitive timing abstraction model. Environmental issues typically include different external conditions, such as input signal switching time and output capacitive loading for the circuit, that are influenced by the circuitry surrounding the basic timing abstraction model. The method for modeling circuit environmental sensitivity involves creation of delay components that allow for modeling the circuit environmental sensitivities while maintaining the transparent regions of the circuit. To properly model the environment effects, zero delay elements may be inserted at input and output ports of the basic timing abstraction model, producing an improved abstraction model that retains accuracy and efficiency of the basic timing abstraction model.

19 Claims, 5 Drawing Sheets

MODELING CIRCUIT ENVIRONMENTAL SENSITIVITY OF A MINIMAL LEVEL SENSITIVE TIMING ABSTRACTION MODEL

CROSS-REFERENCE TO RELATED APPLICATIONS

This application is related to commonly assigned U.S. patent application Ser. No. 09/927,856, entitled "A Minimal Level Sensitive Timing Representative of a Circuit Path;" U.S. patent application Ser. No. 09/928,161, entitled "A Minimal Level Sensitive Timing Abstraction Model Capable of Being Used in General Static Timing Analysis Tools;" U.S. patent application Ser. No. 09/927,857, entitled "Improved Load Sensitivity Modeling in a Minimal Level Sensitive Timing Abstraction Model;" and U.S. patent application Ser. No. 09/927,204, entitled "Enabling Verification of a Minimal Level Sensitive Timing Abstraction Model."

TECHNICAL FIELD

The technical field relates to timing analysis systems, and, in particular, to static timing analysis of a digital circuit.

BACKGROUND

A wide variety of design verification tools are required to produce a working integrated circuit from a functional specification. These tools analyze different parameters of a circuit design to insure that the circuit will function properly after the circuit is fabricated. One important set of verification tools includes timing analysis tools, which are widely used to predict the performance of very large scale integrated (VLSI) designs. Often, timing analysis determines the best path for a designer to pursue or helps to optimize the overall circuit design. In digital circuits, timing considerations can be critical to proper performance. Timing analysis tools may be either static or dynamic.

Dynamic timing analysis (DTA) tools provide the most detailed and accurate information obtainable concerning the performance of a circuit. With DTA, a design engineer must provide sets of waveforms to simulate the conditions under which a circuit will operate. This type of timing analysis is often generated through simulation of a circuit by simulation programs that operate at the transistor level. Examples of such circuit simulation programs are SPICE by University of California at Berkeley and ASTAP by IBM Corporation. For more information on SPICE, refer to "SPICE2: A Computer Program to Simulate Semiconductor Circuits," by L. W. Nagel, Technical Report ERL-M520, UC-Berkeley, May 1975. These DTA programs typically operate by solving matrix equations relating to the circuit parameters, such as voltages, currents, resistances and capacitances. Additionally, such circuit simulation approaches to performance analysis are pattern dependent, or stated another way, the possible paths and the delays associated with the paths depend upon a state of a controlling mechanism or machine of the circuit being simulated. Thus, the result of a DTA depends on the particular test pattern, or vector, applied to the circuit.

While such circuit simulation programs and DTA tools provide high accuracy, long simulation times are required because a large number of patterns must be simulated since the best and worst case patterns are not known before the simulation occurs. The number of simulations which must be performed is proportional to $2^n$, where "n" is a number of inputs to the circuit being simulated. Thus, for circuits having a large number of inputs, DTA is not always practical.

Static timing analysis (STA) tools are also widely used to predict the performance of VLSI designs. In STA, a design engineer applies signal arrival and departure times only at each block input, not at base waveform. Additionally, each signal is assumed to switch independently in each machine cycle, i.e., static timing analyzer is waveform independent and simulates the most critical arrival time at each node in the circuit.

In STA, since only the best and worst possible rising and falling times are computed for each signal in the circuit, such times are typically determined in a single pass through a topologically-sorted circuit. When referring to a topologically-sorted circuit, a signal time associated with each subcircuit of the circuit being tested is determined in a sequential nature. Therefore, the signal time associated with a first subcircuit whose output will be propagated to a second subcircuit must be determined before the signal time associated with the second subcircuit is calculated. Typical static analysis methods are described in "Timing Analysis of Computer Hardware," by Robert B. Hitchcock, Sr., et al., IBM J. Res. Develop., Vol. 26, No. 1, pp. 100–105 (1982).

Timing models used in timing analysis are blocks of computer data that can be used to recreate the timing behavior of an electronic circuit. The size of timing models should be as small as possible for a given complexity of circuit, while maintaining the accuracy of the timing model. In general, a smaller timing model will not only require less space in a computer memory, but also will be faster for a computer to evaluate. Often, timing model accuracy is sacrificed to shrink the timing model and speed its evaluation. This is especially important for large timing models that represent an entire subcircuit of an electronic system.

A popular technique for shrinking a timing model involves creating port-based timing models as opposed to path-based timing models. Port-based timing models analyze an electronic circuit to isolate and maintain only the timing behavior that can be observed at the circuit's connections, often referred to as ports, to surrounding circuits. Any timing behavior of a circuit that is internal to the circuit is discarded, leaving only the information that is essential to verifying the timing behavior of the circuit in the context of surrounding circuits. The port-based timing models have been used in both timing simulation and STA. The timing models are accurate, and generally provide good compression of timing model size.

In port-based timing modeling, the electronic circuit is analyzed to determine the longest time for an electronic signal to pass from each input port to each output port. Often the shortest time is determined as well. An edge triggered latch in the circuit, controlled by a clock signal, acts much like an internal port and is also considered a start point and an end point for electronic signals. At the instant the value of its clock signal changes, the edge triggered latch passes the value of its data signal to its output signal. At other times, the edge triggered latch holds the value of its output signal constant. Analysis is also done to determine the longest time for an electronic signal to pass from each input port to the input signals of each edge triggered latch and from the output signal of each edge triggered latch to each output port.

In true port-based timing models, the internal latch nodes are abstracted away and only the longest time for an electronic signal to arrive at each given output port is calculated. Often the shortest time is calculated as well. The latest (and often also the earliest) allowed time for signal to arrive at each given input port is also calculated. For circuits with edge triggered latches, these calculations are rather simple. The longest time for a signal to arrive at the output port is the time when the clock signal changes on the edge triggered latch that is connected to the output port by a combinational circuitry, plus the time the signal passes from the latch to the output port. If more edge triggered latches are connected to the output port by a combinational circuitry, the latest signal arrival from all the latches is considered. The latest allowed time for the signal to arrive at the input port is the time when the clock signal changes on the edge triggered latch that is connected to the input port by a combinational circuitry, minus the time the signal passes from the input port to the latch, minus the setup time for the latch (due to the physical characteristics of the latch electronic circuitry, the signal value at the latch input must be stable before the clock signal changes). If more latches are connected to the input port by a combinational circuitry, the latest time for the signal to arrive at the input port is the minimum from the latest times determined for the individual latches as described above. The latch that determines the minimum time is referred to as the most critical latch. PathMill's Black box timing model supports these calculations. However, the calculations become more complicated for circuits that use level triggered latches, and PathMill's Black box cannot accurately model such circuits.

Many digital circuits use level triggered latches, i.e., transparent latches, in place of edge triggered latches. Like an edge triggered latch, a level triggered latch is controlled by a clock signal. The edge triggered latches are active only at the instant the clock signal changes, while the level triggered latches can be active at any time that the clock signal remains at a specified voltage (high or low voltage).

The level triggered latches in a circuit can time borrow amongst themselves. Time borrowing is possible when the combinational logic between two latches requires more time than the clock phase to compute a stable value. However, if the logic following the second latch requires less than an entire clock phase to compute a stable value, then the value propagated by the first latch need not become stable until some time after the second latch becomes active. The second set of logic will still have enough time to propagate a stable value, even though the calculations did not begin until some time after the latches become active. Time borrowing is an essential technique for latch-based design. High performance or custom designed circuits, such as modern CPUs, rely on level triggered latches to take advantage of the time borrowing that helps reach high clock frequencies. Timing models that do not support time borrowing are inadequate for such designs.

When the clock signal transitions to inactivate the latch, the level triggered latch latches the input data and holds that value on the output port until the clock transitions again. The input data is fed to the level triggered latch via the latch's data pin. The output of the latch is available on the latch's output pin. The clock signal is connected to the latch using the latch's clock pin.

Due to the physical characteristics of the electronic circuitry from which physical latches are implemented, the transition between when the latch is transparent and when the latch holds its value is not instantaneous. Therefore, the value on the data pin must be available a certain amount of time before the clock signal transitions to a low voltage. This time is called the setup time. Routines that verify that the data is available early enough to meet the setup time are called setup checks and violations are called setup violations. In addition to the setup time, the data value must remain constant for a certain amount of time after the clock transitions to low. This time is called the hold time. Routines that verify that the data is available long enough to meet the hold time are called hold checks and violations are called hold violations. If a setup or a hold violation occurs, the latch might not contain a valid value. Thus, it is important that timing models accurately represent setup and hold times.

In a timing model block for a circuit, a signal arriving at the output ports depends on the signal arrival time at the input ports, referred to as stimulus. In a stimulus dependent timing model, the parameters of the timing model are limited to certain intervals of the arrival times. If the stimulus is outside of the interval, the timing model does not properly represent the circuit and the model needs to be rebuilt each time when the stimulus change. In a stimulus independent timing model, the timing model works irrespective of when the signal arrives at the input ports, i.e., always generating correct arrival at the output port.

Currently available timing models that can be input into general STA tools fall into three categories. PathMill's conventional Black box timing models are port-based and stimulus independent. However, the conventional Black box timing models do not support transparency. PathMill's new transparent Black box timing models are port-based with limited support of transparency. However, the new Transparent Black box timing models are stimulus dependent. Pathmill's Gray box timing models support transparency and are stimulus independent. However, the Gray box timing models are not port-based.

For circuits with level triggered latches, the Transparent Black box timing models are significant improvement over the conventional Black box timing models. The latest allowed time for the signal to arrive at a given input port, i.e., the time before setup violation occurs, is calculated, considering not only the first latch connected to the given input port by a combinational circuitry. The second latch or other sequential element that is connected to the first latch by a combinational circuitry is also considered, as well as the third and any successive latch that may be on a transparent path from the given input port. Considering all latches is important because, in circuits with transparent latches, the second, third, or other latch on the transparent path from an input port may be more critical than the first latch, i.e., the second, third, or other latch determines the latest time on the input port before the setup violation occurs, employing similar calculation procedure as described earlier for the first latch in the conventional Black box timing model. Similarly, the longest time for an electronic signal to arrive at the output port is calculated, considering not only the last latch connected to the output port by a combinational circuitry, but also the previous latch that is connected to the last latch by a combinational circuitry, as well as any earlier latch that may be on a transparent path to the output port.

However, in the Transparent Black box timing model, the signal arrival at the output port on a transparent path is correct only for the input port stimulus that was used to build the model. When the input stimulus changes, the model needs to be rebuilt or the signal arrivals at output ports on transparent paths may be wrong, since the Black box timing model cannot represent the unique clock-controlled connectivity between the input and the output ports on a transparent path. Instead, the output signal arrival time on the most critical transparent path is hard-coded in the model, which makes the model valid only for a particular input stimulus.

Timing abstraction models typically require the modeling of circuit environmental sensitivities. A circuit's performance is dependent on the environment within which the circuit is used. Most available STA tools support environmental sensitivity models. PathMill is such a tool. However, using conventional method to model the environmental sensitivities as part of minimal level sensitive timing abstraction models results in inaccuracies.

PathMill's Gray box timing models support transparency, are stimulus independent, and require a well-defined analytical model to represent the environmental sensitivity. However, Gray box timing models abstract only combinational circuit elements and retain all sequential elements that are represented by internal clock-controlled nodes connected by time-arcs, i.e., not port-based. For blocks with a large number of latches, Gray box timing models have a large number of internal nodes and time-arcs, resulting in a large number of timing checks to be performed and a large number of paths to be traced in a STA run. All timing checks carried out on a lower level of hierarchy need to be repeated again on higher hierarchy levels, because no sequential nodes are abstracted away when moving from one level of hierarchy to the next level. As a result, the large number of timing checks leads to long STA runtimes and large memory requirements, especially on higher hierarchy levels and full chip levels, which, in turn, results in slow roll-up/roll-down times and a need to manually simplify the timing model so that the STA on larger blocks does not run out of memory.

SUMMARY

A method for modeling circuit environmental sensitivity for a basic minimal level sensitive timing abstraction model includes extracting a plurality of parameters from a circuit that includes an input port and an output port, creating an echo-circuit that represents the plurality of parameters. The echo-circuit is lightweight, can be input into any static timing analysis (STA) tools, and may enable a signal to propagate from the input port to the output port only if the signal arrives at the output port later than a clock signal from a most critical clock element controlling the output port. The method further includes adding an input delay arc at the input port and adding an output delay arc at the output port. The input delay arc and the output delay arc are capable of reflecting environmental conditions. Environmental conditions typically include different external conditions such as input signal switching time and output-capacitive loading for the circuit, that are influenced by the circuitry surrounding the basic timing abstraction model. The method for modeling circuit environmental sensitivity involves creation of delay components that allow for modeling the circuit environmental sensitivity factors while maintaining the transparent regions of the circuit. To properly model the environment conditions, zero delay elements may be inserted at the input and output ports of the basic timing abstraction model, producing an improved abstraction model that retains accuracy and efficiency of the basic timing abstraction model.

DESCRIPTION OF THE DRAWINGS

The preferred embodiments of a method for modeling circuit environmental sensitivity of a minimal level sensitive timing abstraction model will be described in detail with reference to the following figures, in which like numerals refer to like elements, and wherein.

DETAILED DESCRIPTION

Figure 1:
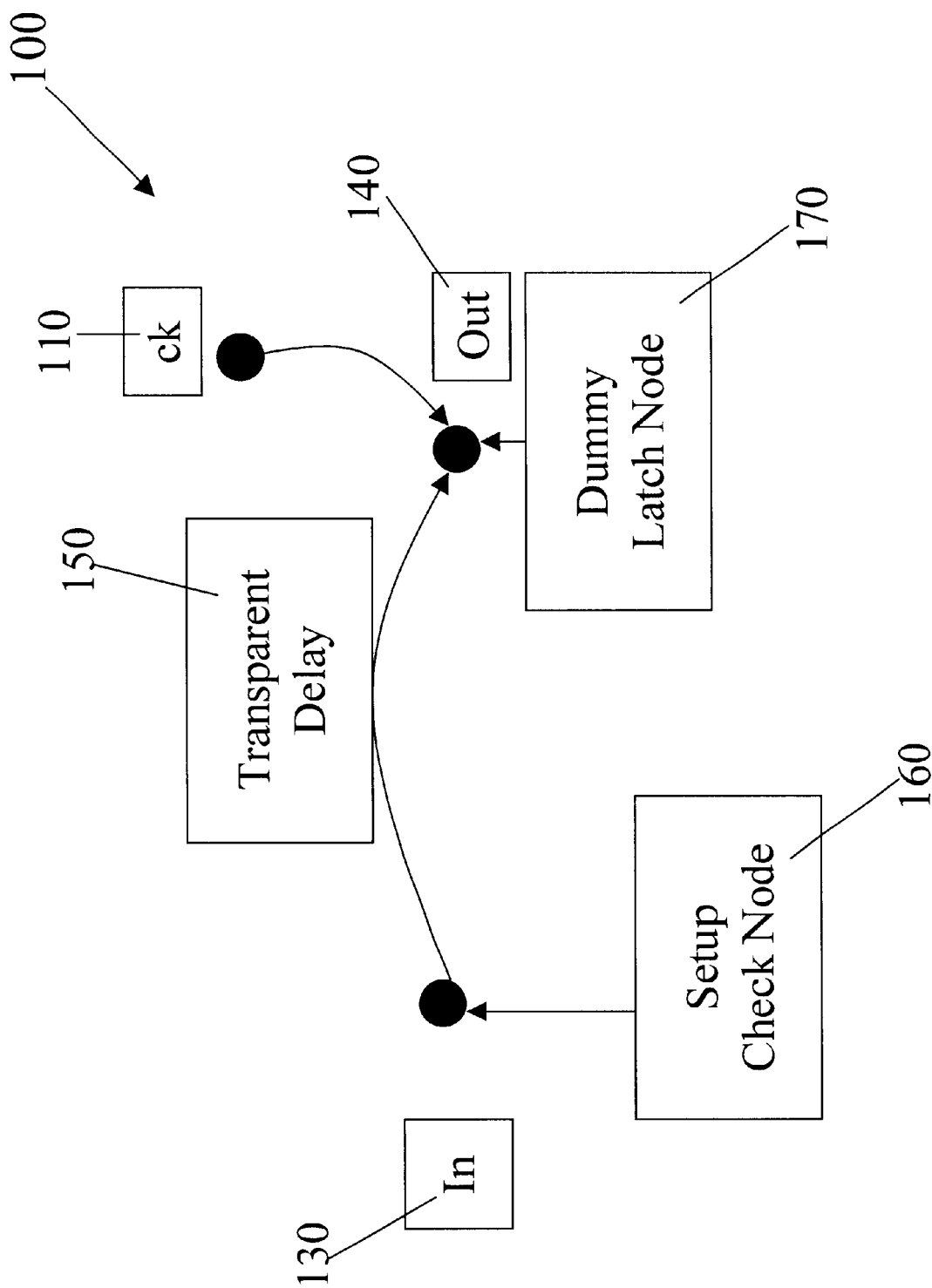
FIG. 1 illustrates an exemplary basic minimal level sensitive transparent timing abstraction model of an exemplary circuit block.

A basic minimal level sensitive timing abstraction model provides for a minimal representation of a digital circuit block, in the form of an equivalent circuit or connectivity network, with a minimum number of internal nodes. The basic timing abstraction model supports transparency and can be input into general static timing analysis (STA) tools to efficiently perform timing analysis on large circuits that contain the modeled circuit block. The circuit block represented by the basic timing abstraction model may contain a combination of sequential and combinational elements, as well as one or more blocks that are themselves this type of timing abstraction model.

The basic timing abstraction model supports multiple levels of hierarchy and limits timing analysis to most critical paths, i.e., a path from an input port to a setup/hold check node, a path from the input port to a dummy latch node that checks for transparency, a transparent path between the input port and an output port, and a path between a most critical clock element and the output port. The multiple levels of hierarchy leads to a significant reduction of the number of internal clock-controlled nodes, which in turn results in significant speed-up of STA runs on large circuits and reduced memory and storage space requirements. Further speed-up of STA runs is achieved by tracing only the most relevant transparent paths to a given output port, i.e., only the paths on which the signal arrives at the output port later than the clock signal from the most critical clock element, which reduces the number of paths fed to the adjacent blocks. The basic timing abstraction model also simplifies the output from the timing analysis and may shorten a designer's time to analyze STA results.

A method and a corresponding apparatus provide for modeling circuit environmental sensitivity for the basic minimal level sensitive timing abstraction model. Environmental conditions typically include different external conditions, such as signal transition time at the circuit input and output capacitive loading for the circuit, that are influenced by the circuitry surrounding the basic timing abstraction model. The method for modeling circuit environmental sensitivity creates delay components that allow for modeling the circuit environmental sensitivity factors while maintaining the transparent regions of the circuit. Specifically, zero delay elements may be inserted at input and output ports of the basic timing abstraction model, producing an improved timing abstraction model that accounts for environmental sensitivity factors while retaining accuracy and efficiency of the basic timing abstraction model.

The purpose of the timing analysis is to simulate signal arrival times at different nodes in a digital circuit to assure proper functionality of the circuit. Within the circuit are clock-controlled nodes and nodes that are not controlled by clocks. On the clock-controlled nodes, the signal must arrive within a certain time interval relative to the clock. For example, for an edge triggered latch, the signal must arrive at the latch before the active edge of the clock, and for a level triggered latch, the signal must arrive before the closing edge of the clock, i.e., while the latch is open or in an active level. If the signal does not arrive within this timing interval, a violation occurs and the circuit may not function properly. Timing analysis is a computer simulation of the digital circuit to simulate arrival times on the clock-controlled nodes and to verify that the signal arrives at the nodes within the allowed time interval.

A micro chip containing digital circuits may have millions of elements, such as transistors, gates, resistors, and interconnects represented by resistors and capacitors. Simulation and timing analysis on a full chip level is expensive. Accordingly, a common practice is to divide the chip into blocks and conduct timing analysis on each of the blocks individually. The blocks are given the characteristics of the real circuit, by abstracting away unnecessary information from the circuit and characterizing the circuit by a set of useful parameters.

Port-based timing models involve less timing simulation than path-based timing models. In port-based timing models, the number of nodes scales with the number of ports. In path-based timing models, the number of nodes scales with the number of paths, which is significantly more than the number of ports in a circuit. The more nodes there are, the longer the timing checks take. So the number of nodes determines how fast the timing checks are performed. In an embodiment of the basic timing abstraction model, which is port-based rather than path-based, the number of timing checks to be performed, i.e., the number of parameters, scales with the number of input ports plus the number of input-to-output port pairs that are connected by transparent paths for at least one input stimulus, which is usually much less than the total number of paths in the circuit.

Accordingly, the speed-up of STA runs that uses the basic timing abstraction model may be achieved as follows. First, the number of timing checks to be performed in most circuits may be reduced to one check for each input port plus one check for each input-to-output port pair that is connected by a transparent path for at least one input stimulus. Second, each timing check may be performed faster in the port-based timing model than in a path-based timing model, because the number of clock controlled internal nodes in the port-based model is small, i.e., in most circuits the number of clock controlled nodes is equal to number of ports. Therefore, a larger part of this port-based model may be stored in the fast computer memory, i.e., the main memory or the very fast microprocessor cache memory, than in the path-based timing models. Third, only the most relevant transparent paths, i.e., paths on which a signal arrives at the output port later than the latest clock signal, are traced to a given output port, reducing the number of paths fed to the adjacent blocks.

Level triggered latches, which support transparency, can be active when any of their clock signals, i.e., clock elements, remain at a high voltage, while edge triggered latches are active only at the instant the clock signals change. Some level triggered latches are active when the clock signals are at low voltage, instead of high voltage, but the processes are the same. The basic timing abstraction model has level triggered latches. In the discussion that follows, level triggered latches are transparent when the clock signals are high, but as will be apparent to one skilled in the art, the techniques described also apply to latches that pass values when the clock signals are low. Also, the following paragraphs describe modeling of maximum (long) path STAs, i.e., the paths with the latest signal arrival at input and output ports. As will be apparent to one skilled in the art, the techniques described also apply to minimum (short) path STAs, i.e., the paths with the earliest signal arrival at the input and output ports, except that there are no short transparent paths in the circuit.

An embodiment of the basic timing abstraction model first extracts a minimal set of characteristics, i.e., parameters, from the modeled circuit in order to simulate timing on the circuit. The parameters include: 1) a required time parameter associated with an input port, i.e., the latest time a signal can arrive at the input port before a setup violation would occur in the modeled circuit on some sequential element, i.e., a latch or a domino logic, connected to the input port by a combinational circuitry and/or a circuitry that consists of one or more transparent sequential elements; 2) a valid time parameter associated with an output port, i.e., the latest time the signal from any clock element arrives at the output port; and 3) an input-to-output delay parameter that represents a time delay a signal passes from the input to the output port on a transparent path.

Next, the basic timing abstraction model creates an echo-circuit that represents the characteristics and can be input into virtually any STA tool. The echo-circuit may be a basic timing abstraction model represented in PathMill's Gray box format.

The first characteristic to be extracted is a setup/hold check time, referred to as a required time, associated with a setup/hold check node at each input port in the basic timing abstraction model. Associating timing checks with the input port do not reduce the universality of the basic timing abstraction model because STA analysis tools support circuits with setup/hold timing checks attached to any node.

STA uses two different simulations. A simulation for maximum paths, i.e., the setup check, determines the latest time a data signal can arrive at the input port before any violation in the modeled circuit will occur. A simulation for minimal paths, i.e., the hold check, determines if the data signal is stable for a long enough time at the input port. The following paragraphs describe the simulation with respect to the maximum path. However, one skilled in the art should appreciate that the minimal path simulation behaves in a similar fashion, except that there are no transparencies in minimal path simulation because there is no input-to-output path.

As described above, the setup check node checks data arrival at the input port with respect to the required time, which is the latest time the data signal can arrive at the input port before any violation would occur in the modeled circuit. In other words, the setup check node checks if the data signal arrives at the input port early enough so that the most critical clock-controlled node of the modeled circuit, i.e., the most critical latch or other sequential element such as the domino logic, will have no violation. The most critical sequential element in the modeled circuit is the sequential element on which the violation occurs with the earliest time arrival at the input port. The most critical path is the one that fails first, and the setup check node checks the required time that corresponds to the time when the failure occurs on the most critical sequential element.

As an example, a circuit with three latches may have the most critical as the second latch. In this example, 800 picoseconds may be required for a signal to propagate from the input port to the second latch, and the signal may be required to be at the second latch at time 1000 picoseconds or earlier. If the signal arrives at the second latch in the modeled circuit at 1000 picoseconds, which is the latest allowed time, there is no violation. On the other hand, if the signal arrives at 1001 picoseconds, a violation occurs. Since 800 picoseconds are required to propagate the signal from the input port to the second latch, the signal must arrive at the input port within 200 picoseconds.

In general, the setup time, SI, at an input port I can be expressed as:

$$SI = \min_{j}(SI_j) \quad (1)$$

$$SI_j = SL_j + (Cycle_j - Cycle_0)T - Delay_j, \quad (2)$$

where $SI_j$ is the latest time a signal can arrive at the input port I before violation would occur on a sequential element, i.e., latch or domino logic, $L_j$ in the modeled circuit, $SL_j$ is the latest time signal can arrive at the sequential element $L_j$ before setup violation would occur on the sequential element, $Cycle_j$ is the clock cycle count on the sequential element $L_j$, $Cycle_0$ is the cycle count on input I (usually $Cycle_0=1$), T is the clock cycle time (the clock period) and $Delay_j$ is the time the signal needs to propagate from the input port I to the sequential element $L_j$.

The setup times $SI_j$ can be obtained, for example, from a Pathmill run with a late stimulus at the input port I and a latch_error_recovery feature turned on. The late stimulus is an arbitrarily chosen stimulus, Lstim, that is so late that with a certainty a setup violation will occur on some sequential element in the circuit (usually, Lstim can be any number that is much higher than the clock period T). Then, the setup time $SI_j$ can be expressed as:

$$SI_j = Lstim - \sum_{k=1}^{j-1} Advance_k + Slack_j, \quad (3)$$

where $Slack_j$ is the timing slack on the sequential element $L_j$, and $Advance_k$ is the timing adjustment introduced by the latch_error_recovery feature on the sequential element $L_k$ that is on the path from the input port I to the sequential element $L_j$.

The setup times, $SI_j$, can be obtained from other commercial STA tools in a similar way. For example, the setup times can also be obtained directly from Pathmill's Transparent Black model, if the signal arrival times at output ports are not subjected to any constraints when such model is generated.

The second characteristic to be extracted is an opening time, referred to as a valid time, associated with a dummy latch node attached to each output port. The dummy latch node may be controlled by a derived clock that has an opening edge offset with respect to the opening edge of a clock port. The derived clock typically becomes active at the time corresponding to the latest signal arrival from the clock port to the output port in the modeled circuit. The dummy latch node compares data signal arrival at the output port with the clock signal arrival of the latest clock at the output port. All paths arriving before the latest clock stop at the dummy latch node, i.e., the paths are not transparent and the clock signal goes to the output port instead. If the data signal arrives after the clock signal, the data signal propagates to the output port.

Multiple paths may converge from multiple input ports to one output port, with each path controlled by a different clock. In the basic timing abstraction model, the dummy latch node enables comparison of the data signal with the latest clock signal. Accordingly, the data signal may be blocked if the signal arrives earlier than any of the clocks converging to the output port. Comparing the paths with the most critical clock significantly reduces the number of paths that arrive at the output port.

In general, the valid time, VO, at an output port O can be expressed as:

$$VO = \max_{j}(VO_j) \quad (4)$$

$$VO_j = DO_j - (Cycle_j - 1)T \quad (5)$$

$$DO_j = DC_j + Delay_j, \quad (6)$$

where $DO_j$ is the signal arrival time at the output port O from clock port $C_j$, $DC_j$ is the signal arrival at a clock port $C_j$, $Delay_j$ is the time the signal needs to propagate from the clock port $C_j$ to the output port O, $VO_j$ is the time $DO_j$ adjusted to the first clock cycle, $Cycle_j$ is the clock cycle count on the output port O and T is the clock cycle time (the clock period). Note that the valid time VO calculated from equations (4)–(6) is adjusted to be in the first-clock cycle. The offset between the clock port $C_j$ and the derived clock controlling the dummy latch node will be set to time VO–$DC_j$. The STA tool will determine whether or not the input signal will pass the dummy latch node in the basic timing abstraction model based on the valid time and the cycle count on the path from the input port.

The most critical path from the clock port to the output port O will have a delay $Delay_{jmax} = DO_{jmax} - DC_{jmax}$, where $DO_{jmax}$ is the signal arrival time at the output port O from the most critical clock port $C_{jmax}$ that determines the valid time according to equation (4).

The clock signal arrival times, $DO_j$ and the clock cycle counts, $Cycle_j$, can be obtained from any commercial STA tool, such as Pathmill. The clock signal arrival times and the clock cycle counts are stimulus independent because the clock signal propagation is independent on input signal arrival times.

The third characteristic to be extracted is an input-to-output delay, i.e., transparent delay arc. The delay exists only if, for some stimulus, the signal propagates transparently between the input port and the output port. The dummy latch node opens at the valid time and closes at the latest possible signal arrival time from an input port that has a timing path to the output port. Such time is determined by the required times and the path delays. Accordingly, the dummy latch node/enables a signal to propagate from the input port to the output port only if the signal arrives at the output port later than a clock signal on the most critical clock controlling the dummy latch node. This feature is acceptable for STA tools because STA only deals with the most critical path, i.e., the most critical arrival at any given node.

Therefore, all inputs that arrive at the output port before the latest clock are blocked by the dummy latch node and will not propagate to the next block. The blocking of early arrived inputs simplifies output from the timing analysis because only the most relevant transparent paths are considered. More importantly, the basic timing abstraction model reduces the number of paths fed to the adjacent blocks and speeds-up the STA runs, because, by blocking the number of paths that leave the first block, the total number of paths in the circuit may be decreased significantly. In addition, by limiting timing analysis to the most critical paths, the basic timing abstraction model simplifies the output from the timing analysis and shortens designer's time to analyze STA results because only the paths that are important are printed in the report.

The input-to-output delays can be obtained from any commercial STA tool, such as Pathmill, when the input stimulus is set to the required time, SI, described above. These characteristics, i.e., the required time, the valid time, and the input-to-output delay, may be obtained from STA analysis as discussed above. Compared with Pathmill's Black box and Transparent Black box timing models, the basic timing abstraction model described above represents each input-to-output transparent path by an equivalent circuit that consists of time-arcs (or connectivity networks) and clock-controlled (dummy latch) nodes to model signal arrivals at the output ports independently on input stimulus. The equivalent circuit may be designed such that the tracing of false non-transparent paths is avoided and the reported transparent paths are limited to those critical paths that may be important for the designer. In other words, the basic timing abstraction model is input-stimulus independent and needs to be rebuilt only when the clock waveforms change.

The basic lightweight timing abstraction model is typically built under the assumption that the transparent region of the setup check node and the dummy latch node is not sensitive to the environmental conditions. The improved timing abstraction model, on the other hand, may model environmental sensitivity factors by creating delay components in the basic timing abstraction model. FIG. 1 illustrates an exemplary basic minimal level sensitive transparent timing abstraction model 100 of an exemplary circuit block. A setup check node 160 is attached to an input port 130, while a dummy latch node 170, controlled by a derived clock 110, is connected to an output port 140. A transparent delay arc 150 is contained between the setup check node 160 and the dummy latch node 170. The transparent delay arc 150 may be represented as an intrinsic transparent delay 250 (shown in FIG. 2) with no external influence. The transparent delay arc 150, the setup check node 160, and the dummy latch node 170 factors in the basic timing abstraction model 100 may not sufficiently model the environmental sensitivity.

Figure 2B:
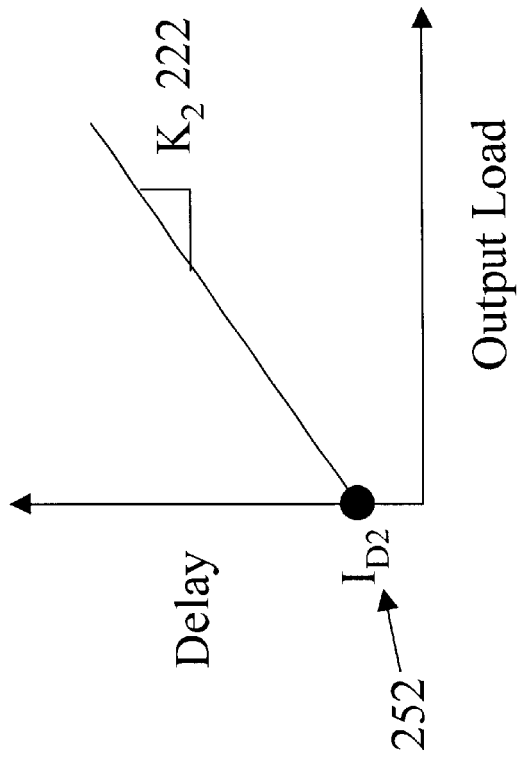
FIGS. 2(a) and 2(b) illustrate exemplary input-to-output delay functions reflecting signal transition time at an input and capacitive loading at an output.
Figure 2A:
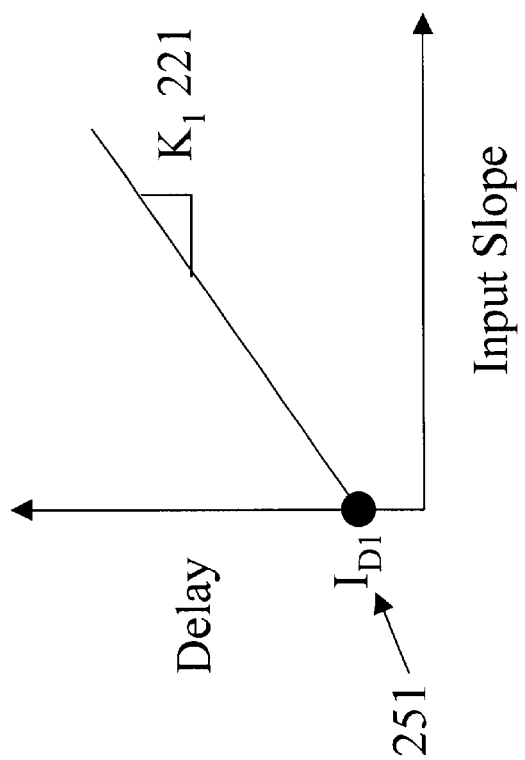

FIGS. 2(a) and 2(b) illustrate exemplary input-to-output delay functions reflecting signal transition time at a circuit input (input slope) and capacitive loading at a circuit output (output capacitive loading). In most timing analysis tools, environmental conditions are typically attached to the input-to-output delay component. An exemplary improved timing abstraction model 300 (shown in FIG. 3) involves creation of delay components that allow for modeling circuit environment sensitivity factors while maintaining the transparent regions of the circuit.

Environmental sensitivity typically involves the input slope and the output capacitive loading. The performance of a circuit may vary based on the input and output factors. For example, for an input signal switching an inverter, the delay and the rate at which an output switches depend on many factors, such as transistor sizes, supply voltage, threshold voltage, input signal waveform, and output capacitive loading, and other input and output factors. Within minimal level sensitive timing abstractions, most variables are typically fixed. However, the receiving transistors at the input port 130 are sensitive to the input slope and the driving transistors at the output port 140 are sensitive to the output capacitive loading.

Referring to FIGS. 2(a) and 2(b), the environmental sensitivity factors may be split into input sensitivity factors, i.e., the input slope, and output sensitivity factors, i.e., the output capacitive loading. The input slope represents sensitivity of an input to the environmental conditions. Signal rise or fall times at the input port 130, which are variables that typically affect the input-to-output delay, may be calculated. The output capacitive loading represents sensitivity of an output to the environmental conditions. Similarly, signal rise or fall times at the output port 140, which also affect the input-to-output delay, may be calculated. The input-to-output delay and the signal rise or fall times at the output port 140 are typically sensitive to the input slope and the output capacitive loading.

If no input slope or output capacitive loading exists, the input-to-output delay may be represented in FIG. 2(a) as $I_{DI}$ 251, which stands for an intrinsic input delay, and in FIG. 2(b) as $I_{D2}$ 252, which stands for an intrinsic output delay. On the other hand, if the input slope or output capacitive loadings, i.e., the environmental conditions, are present, an equation may be generated to reflect the sensitivity of the input-to-output delay to the environmental conditions. For example, as shown in FIG. 2(a) or 2(b), a linear equation may be generated with a slope $K_1$ 221 or $K_2$ 222, respectively, to reflect the input slope and the output capacitive loading. In this example, the input-to-output delay increases linearly with respect to the input slope, as shown in FIG. 2(a), or the output capacitive loading, as shown in FIG. 2(b).

A characterization tool that allows for the abstraction may be used to generate the input slope or the output capacitive loading in relation to the input-to-output delay. For example, different input slopes may be simulated by measuring the input-to-output delay at five different input slopes and interpolating through a straight line to create a slope that best fits the behavior of the circuit for the five different input slopes. The same may be accomplished for the output capacitive loading, i.e., selecting five different output capacitive loading values, simulating and measuring the input-to-output delays, and creating a straight line. Even though straight line simulation is typically used, the simulation may also result in a higher order polynomial or a multi-dimensional table.

Figure 3:
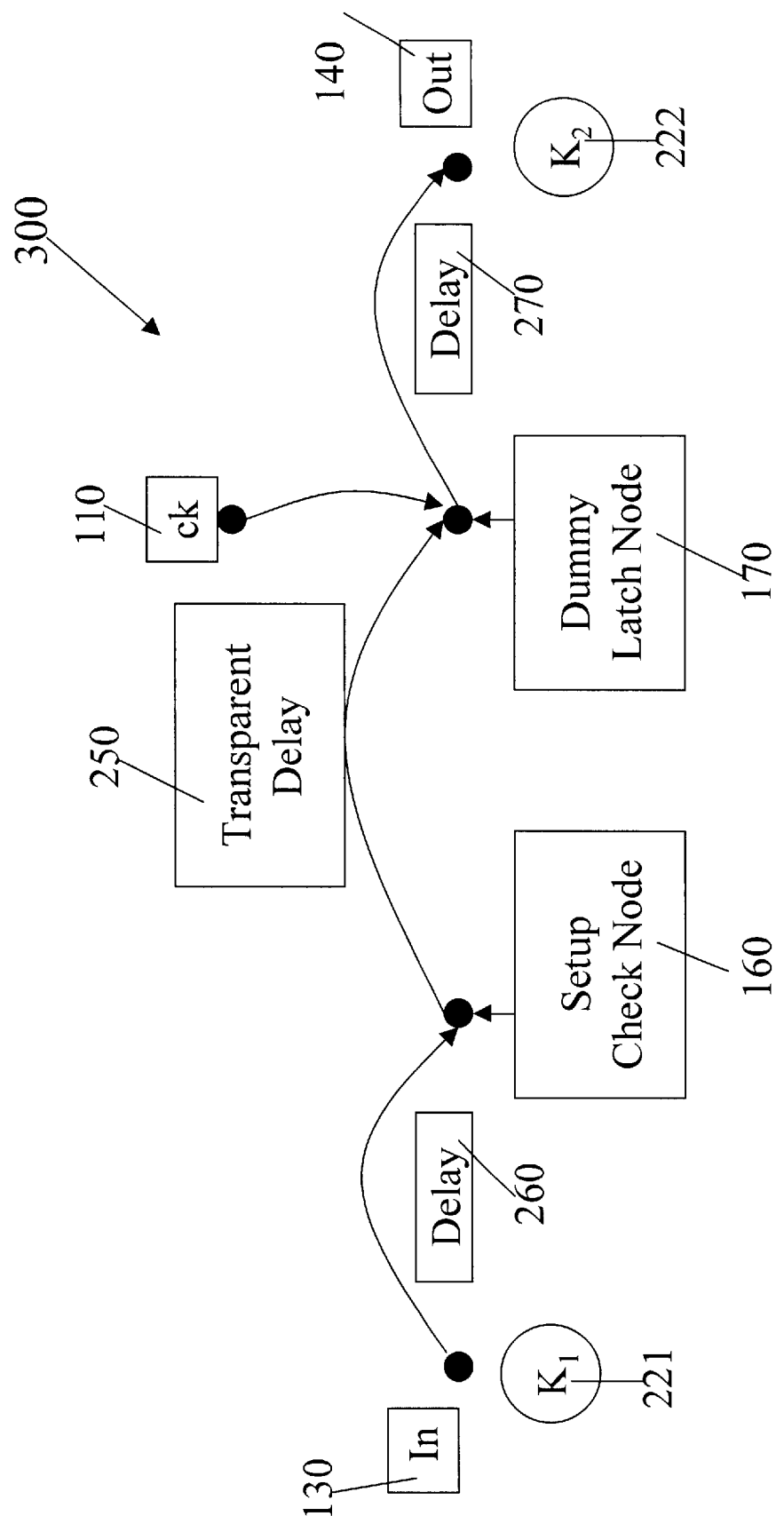
FIG. 3 illustrates an exemplary improved timing abstraction model that accounts for environmental sensitivities.

FIG. 3 illustrates an exemplary improved timing abstraction model 300 that accounts for environmental sensitivities. To properly model the environment conditions, zero delay elements 260, 270 may be inserted at the input port 130 and the output port 140 of the basic timing abstraction model 100. An input slope sensitivity factor 260 i.e.; an input delay arc, may be added to the intrinsic input delay $I_{DI}$ 251 at the setup check node 160. The inserted input delay arc 260 has a zero delay with an input slope of zero. As the input slope increases (due to the environmental conditions), the input delay arc 260 changes gradually. As a result, the setup check time may change accordingly, accounting for the environmental sensitivity. The improved timing abstraction model 300 may also account for the delay adjustment before a setup check is performed at the input port 130. Only if the setup check passes, the adjusted delay may be added to the intrinsic input delay $I_{DI}$ 251. As a result, changes in the environmental conditions may be reflected on the input delay arc 260.

Similarly, at the output, the improved timing abstraction model 300 may account for delay adjustments after the input-to-output path is determined as transparent, by adding an output capacitive loading sensitivity factor, i.e., an adjusted output delay arc 270, to the intrinsic output delay $I_{D2}$ 252. As a result, the environmental conditions may be reflected on the output delay arc 270.

Adding the input slope and the output capacitive loading sensitivity factors 260 and 270, respectively, enables the circuit to be analyzed at nominal (estimated) or actual (measured through simulation) conditions.

For example, a circuit has an input slope of 50 picoseconds, an output capacitive loading of 200 picofarads, and a transparent delay of 800 picoseconds from an input port to the most critical setup check node. After STA is run on the circuit with input slopes of, for example, 25 picoseconds, 40 picoseconds, 75 picoseconds and 100 picoseconds, delays resulted are, for example, 783 picoseconds, 790 picoseconds, 810 picoseconds and 825 picoseconds, respectively. A linear equation may be generated based on the sets of data, where a line representing the equation crosses the y-axis around 760 picoseconds. Therefore, a setup check time of 760 picoseconds may be applied in the improved timing abstraction model 300, creating an input delay arc 260. When the improved timing abstraction model 300 is used in a circuit block, i.e., as a component within a larger circuit, the actual input slope may be, for example, 55 picoseconds, which may result in an incremental change of around 45 picoseconds. The STA tool may add 45 picoseconds to the total delay up to the input delay (which is 760 picoseconds). Thus, the input delay at the boundary of the circuit block is 760+45=805 picoseconds.

Similar measurements and calculations may be performed at the output port for an output delay arc 270. In a similar fashion, a transparent delay arc 250 may be calculated. Since the transparent delay depends on the input slope and the output capacitive loading, both the input slope values and the output capacitive loading values may be used for the calculation. Environmental sensitivities are typically based on the first logic gate in the circuit block, therefore the input sensitivity factors for the transparent delay arc 250 are the same as for the input delay arc 260, and the output sensitivity factors are the same as for the output delay arc 270.

Accordingly, by extracting the environmental sensitivity factors to the two zero delay arcs 260, 270, the improved timing abstraction model 300 reflects environmental conditions in modeling the circuit.

Figure 4:
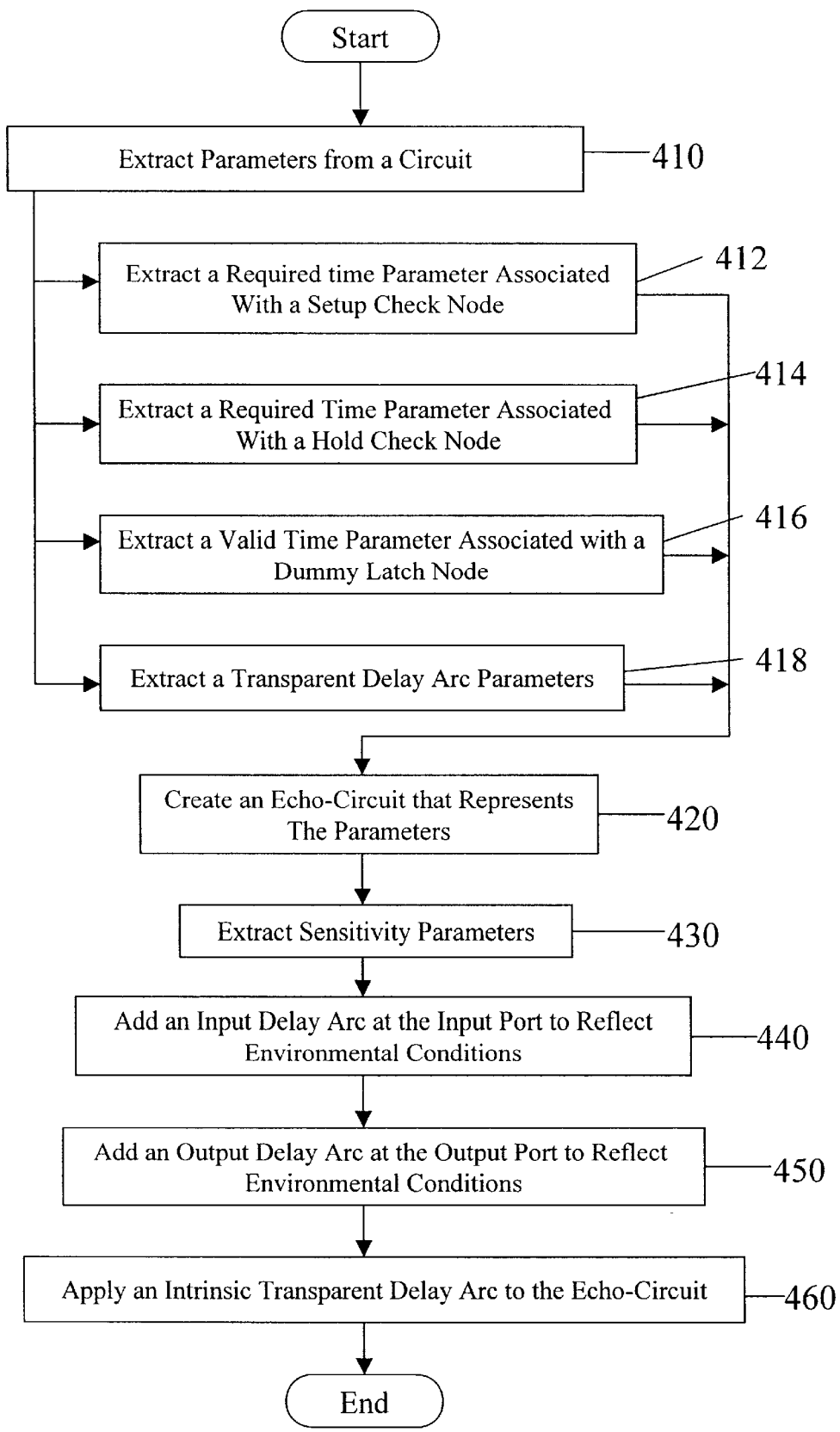
FIG. 4 is a flow chart illustrating an exemplary method for modeling circuit environmental sensitivity for the exemplary improved timing abstraction model.

FIG. 4 is a flow chart illustrating an exemplary method for modeling circuit environmental sensitivity for the exemplary improved timing abstraction model 300. First, parameters may be extracted from a circuit that includes sequential elements, such as latches or domino logics, controlled by clock elements, step 410. The parameters to be extracted may include a required time parameter associated with a setup check node, step 412, a required time parameter associated with a hold check node, step 414, a valid time parameter associated with a dummy latch node, step 416, or a transparent delay arc parameter, step 418. Next, an echo-circuit may be created to represent the parameters, step 420. The echo-circuit may enable a signal to propagate from an input port to an output port only if the signal arrives at the output port later than a clock signal from the most critical clock element controlling the output port. In step 430, circuit sensitivity parameters may be extracted. Thereafter, an input delay arc 260 may be added at the input port to reflect environmental conditions, step 440. Similarly, an output delay arc 270 may be added at the output port to reflect the environmental conditions, step 450. Finally, a transparent delay arc 250 may be applied to the echo-circuit so that the echo-circuit is capable of reflecting the environmental conditions, step 460.

Figure 5:
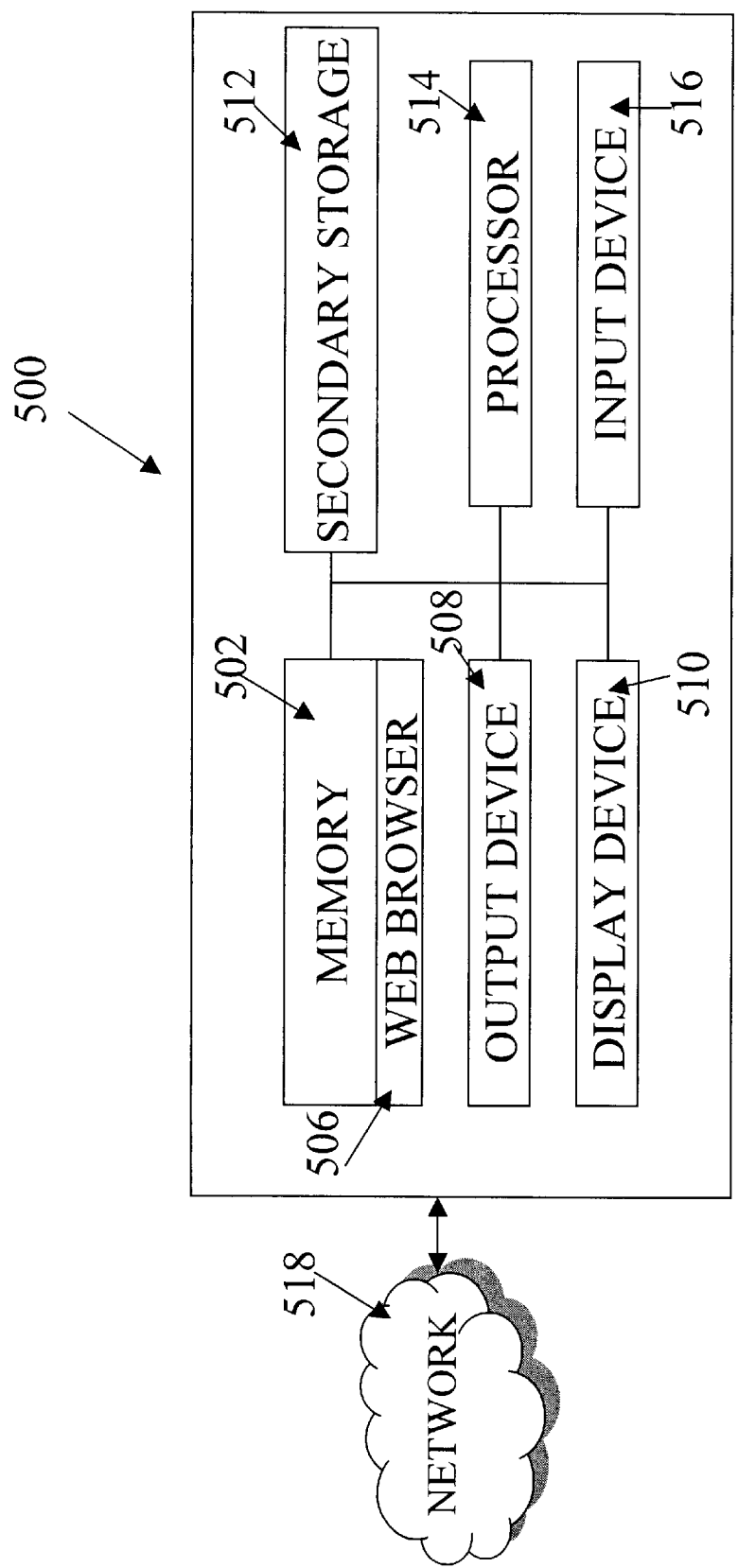
FIG. 5 illustrates exemplary hardware components of a computer that may be used in connection with the improved timing abstraction model for modeling circuit environmental sensitivity.

FIG. 5 illustrates exemplary hardware components of a computer 500 that may be used in connection with the improved timing abstraction model 300 for modeling circuit environmental sensitivity. The computer 500 includes a connection with a network 518 such as the Internet or other type of computer or telephone networks. The computer 500 typically includes a memory 502, a secondary storage device 512, a processor 514, an input device 516, a display device 5106 and an output device 508.

The memory 502 may include random access memory (RAM) or similar types of memory. The memory 502may be connected to the network 518 by a web browser 506.

The web browser 506 makes a connection by way of the world wide web (WWW) to other computers, and receives information from the other computers that is displayed on the computer 500. Information displayed on the computer 500 is typically organized into pages that are constructed using specialized language, such as HTML or XML. The secondary storage device 512 may include a hard disk drive, floppy disk drive, CD-ROM drive, or other types of non-volatile data storage, and may correspond with various databases or other resources. The processor 514 may execute information stored in the memory 502, the secondary storage 512, or received from the Internet or other network 518. The input device 516 may include any device for entering data into the computer 500, such as a keyboard, key pad, cursor-control device, touch-screen (possibly with a stylus), or microphone. The display device 510 may include any type of device for presenting visual image, such as, for example, a computer monitor, flat-screen display, or display panel. The output device 508 may include any type of device for presenting data in hard copy format, such as a printer, and other types of output devices including speakers or any device for providing data in audio form. The computer 500 can possibly include multiple input devices, output devices, and display devices.

Although the computer 500 is depicted with various components, one skilled in the art will appreciate that the computer 500 can contain additional or different components. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or ROM. The computer-readable media may include instructions for controlling the computer 500 to perform a particular method.

while the method and apparatus for modeling circuit environmental sensitivity of a minimal level sensitive timing abstraction model have been described in connection with an exemplary embodiment, those skilled in the art will understand that many modifications in light of these teachings are possible, and this application is intended to cover any variations thereof.

What is claimed is:

1. A method for modeling circuit environmental sensitivity for a minimal level sensitive timing abstraction model, comprising:

extracting a plurality of parameters from a circuit that includes an input port and an output port;

creating an echo-circuit that represents the plurality of parameters and models environmental sensitivity on a circuit block, wherein the echo-circuit is stimulus independent, port-based, has no internal latch nodes, and is used in standard static timing analysis (STA) tools, wherein the echo-circuit includes a dummy latch node that is controlled by an internally generated clock signal that becomes active when a latest clock signal from the circuit arrives at the output port, and wherein the echo-circuit enables a signal to propagate from the input port to the output port only if the signal arrives at the output port later than a latest clock signal from any pin clock signal controlling the output port;

adding an input delay arc at the input port;

adding an output delay arc at the output port; and applying a transparent delay arc to the echo-circuit, whereby the echo-circuit reflects environmental conditions on said circuit block.

2. The method of claim 1, wherein the extracting the plurality of parameters step includes extracting a required time parameter associated with a setup check node.

3. The method of claim 1, wherein the extracting the plurality of parameters step includes extracting a required time parameter associated with a hold check node.

4. The method of claim 1, wherein the extracting the plurality of parameters step includes extracting a transparent delay arc parameter that represents a time delay a signal passes from an input port to an output port of the circuit.

5. The method of claim 1, wherein the adding the input delay arc step includes adding the input delay arc to an intrinsic input delay element at the input port.

6. The method of claim 1, wherein the adding the output delay arc step includes adding the output delay arc to an intrinsic output delay element at the output port.

7. The method of claim 1, wherein the creating the echo-circuit step includes creating a timing abstraction model that is port-based.

8. The method of claim 1, wherein the creating the echo-circuit step includes creating a timing abstraction model that has level triggered latches.

9. The method of claim 1, wherein the creating the echo-circuit step includes creating a timing abstraction model that is stimulus independent.

10. An improved minimal level sensitive timing abstraction model capable of modeling environmental sensitivity, comprising:

a check node connected to an input port at a circuit and, wherein the check node establishes a required time;

a dummy latch node connected to an output port of said circuit, wherein the dummy latch node is controlled by an internally generated clock signal that becomes active when a latest clock signal from said circuit arrives at the output port, and wherein the dummy latch node enables a signal to propagate from the input port to the output port only if the signal arrives at the output port later than a latest clock signal from any pin clock signal controlling the dummy latch node;

an input delay arc added to the check node at the input port; and an output delay arc added to the dummy latch node at the output port, whereby the timing abstraction model reflects environmental conditions, wherein the timing abstraction model models environmental sensitivity on a circuit block and is stimulus independent, port-based and has no internal latch nodes.

11. The improved minimal level sensitive timing abstraction model of claim 10, wherein the check node is a setup check node.

12. The improved minimal level sensitive timing abstraction model of claim 10, wherein the check node is a hold check node.

13. The improved minimal level sensitive timing abstraction model of claim 10, further comprising a transparent delay arc that represents a time delay a signal passes from the input port to the output port of the circuit path.

14. The improved minimal level sensitive timing abstraction model of claim 10, wherein the latches are level triggered latches enabling time borrowing.

15. A computer readable medium providing instructions for modeling circuit environmental sensitivity for a minimal level sensitive timing abstraction model, the instructions comprising:

extracting a plurality of parameters from a circuit that includes an input port and an output port;

creating an echo-circuit that represents the plurality of parameters and models environmental sensitivity on a circuit block, wherein the echo-circuit is stimulus independent, port-based, has no internal latch nodes, and is used in standard static timing analysis (STA) tools, wherein the echo-circuit includes a dummy latch node that is controlled by an internally generated clock signal that becomes active when a latest clock signal from the circuit arrives at the output port, and wherein the echo-circuit enables a signal to propagate from the input port to the output port only if the signal arrives at the output port later than a latest clock signal from any pin clock signal controlling the output port;

adding an input delay arc at the input port;

adding an output delay arc at the output port; and applying a transparent delay arc to the echo-circuit, whereby the echo-circuit reflects environmental conditions on said circuit block.

16. The computer readable medium of claim 15, wherein the instructions for extracting the plurality of parameters step includes instructions for extracting a required time parameter associated with a setup check node.

17. The computer readable medium of claim 15, wherein the instructions for extracting the plurality of parameters step includes instructions for extracting a transparent delay arc parameter that represents a time delay a signal passes from an input port to an output port of the circuit.

18. The computer readable medium of claim 15, wherein the instructions for adding the input delay arc step includes instructions for adding the input delay arc to an intrinsic input delay element at the input port.

19. The computer readable medium of claim 15, wherein the instructions for adding the output delay arc step includes instructions for adding the output delay arc to an intrinsic output delay element at the output port.

* * * * *